(12) United States Patent
Ozaki et al.

(10) Patent No.: US 7,595,582 B2
(45) Date of Patent: Sep. 29, 2009

(54) RESONATOR, ULTRASONIC DIE BONDING HEAD, AND ULTRASONIC DIE BONDING APPARATUS

(75) Inventors: Yukio Ozaki, Kawasaki (JP); Toshinori Kasuga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 236 days.

(21) Appl. No.: 11/143,646

(22) Filed: Jun. 3, 2005

(65) Prior Publication Data

US 2006/0169746 A1    Aug. 3, 2006

(30) Foreign Application Priority Data

Jan. 28, 2005   (JP) .............................. 2005-021227

(51) Int. Cl.
   *H01L 41/053* (2006.01)
(52) U.S. Cl. .................. 310/348; 310/311; 310/323.01; 310/351
(58) Field of Classification Search ................. 310/348, 310/311, 320, 321; 438/413.2; 228/101
   See application file for complete search history.

(56) References Cited

U.S. PATENT DOCUMENTS

| | | | |
|---|---|---|---|
| 6,172,446 B1 * | 1/2001 | Kanayama et al. | 310/348 |
| 6,247,628 B1 * | 6/2001 | Sato et al. | 228/1.1 |
| 6,437,483 B2 * | 8/2002 | Kikuchi et al. | 310/321 |
| 2003/0019561 A1 | 1/2003 | Tominaga et al. | |

FOREIGN PATENT DOCUMENTS

| | | |
|---|---|---|
| CN | 1282644 A | 2/2001 |
| JP | 2002-210409 | 7/2002 |

* cited by examiner

*Primary Examiner*—Quyen Leung
*Assistant Examiner*—Bryan P Gordon
(74) *Attorney, Agent, or Firm*—Arent Fox LLP.

(57) ABSTRACT

A resonator 1 of the present invention includes: a vibrating member 13 holding an electronic component 12 and applying a vibration to the electronic component 12; and a depressing member 15 applying a depressing force for a side of a substrate 11 to the electronic component 12 through the vibrating member 13. The depressing member 15 includes: leg portions 15*b* which are disposed so as to leave spaces between the leg portions and both side faces 13*a* of the vibrating member 13 parallel with a vibration direction A; and supporting portions 15*c* through which the leg portions 15*b* and the side faces 13*a* of the vibrating member 13 are to be coupled to each other. With respect to a size of a cross section of each of the supporting portions 15*c* parallel with the side face 13*a* of the vibrating member 13, a length L2 along the vibration direction A of the vibrating member 13 is shorter than a length L1 along a depressing direction B of the depressing member 15.

9 Claims, 12 Drawing Sheets

US 7,595,582 B2

RESONATOR, ULTRASONIC DIE BONDING HEAD, AND ULTRASONIC DIE BONDING APPARATUS

BACKGROUND OF THE INVENTION

The present invention relates to a resonator, an ultrasonic bonding head, and an ultrasonic bonding apparatus which are suitable for bonding an electronic component to a substrate.

For example, there is an ultrasonic bonding apparatus for mounting a flip chip type electronic component to a substrate. With this ultrasonic bonding apparatus, an electronic component is vibrated by an ultrasonic wave in a state where the electronic component is depressed against the substrate, whereby bumps of the electronic component are bonded through solid phase reaction to corresponding terminals of the substrate.

This ultrasonic bonding apparatus generally includes a resonator adapted to vibrate in a state of holding an electronic component, an ultrasonic wave generating device for causing the resonator to vibrate, and a pressurizing mechanism for depressing the above resonator to a substrate side.

FIGS. 13 and 14 show conventional ultrasonic bonding apparatuses 50 and 60, respectively. The ultrasonic bonding apparatus 50 shown in FIG. 13 of those ultrasonic bonding apparatuses 50 and 60 has a resonator 53 for holding an electronic component 52 to be joined to a substrate 51 and applying vibrations to the electronic component 52, flange-like supporting members 54 which are provided on both sides of the resonator 53, respectively, and pressurizing mechanism portions 55 which are connected to both sides of the flange-like supporting members 54, respectively.

Note that reference numeral 56 in FIG. 13 designates a sucking tool portion (projection portion) for sucking and holding the electronic component 52. In addition, an ultrasonic oscillator (not shown) is connected to the resonator 53.

A groove 57 is formed throughout the entire periphery of each of the above flange-like supporting members 54. The reason for forming the groove 57 is that rigidity of each of the flange-like supporting members 54 is reduced, and the flange-like supporting members 54 are prevented from impeding the vibrations of the resonator 53.

In addition, the ultrasonic bonding apparatus 60 of FIG. 14 has a resonator 61, and a pressurizing mechanism portion 62. The resonator 61 has a vibrating member 63 holding the electronic component 52 and for applying vibrations to the electronic component 52, and a depressing member 64 being pressurized against the substrate 11 side by the pressurizing mechanism 62 in order to apply a depressing force for a substrate 51 side to the vibrating member 63.

The depressing member 64 and the vibrating member 63 described above are coupled to each other through leg portions 66, 66 which project downward from both end portions of the depressing member 64, and pin-like supporting portions 67 which are provided in lower ends of those leg portions 66, 66, respectively.

As shown in FIG. 15, the above leg portions 66, 66 are disposed so as to leave spaces between the leg portions 66, 66 and side faces 63a of the vibrating member 63.

Moreover, heretofore, a resonator in which leg portions of the depressing member are fixed to a vibrating member by screws has been proposed in addition to the above ultrasonic bonding apparatuses 50 and 60 (refer to Patent document 1 for example).

[Patent document 1] JP 2003-218164 A

SUMMARY OF THE INVENTION

However, in the conventional ultrasonic bonding apparatus 50 shown in FIG. 13, a cross section of each of the flange-like supporting members 54 has a circular configuration and has a relatively large diameter. Hence, there is a possibility that an outer peripheral portion of each of the flange-like supporting members 54 largely projects outward with respect to the sucking tool portion 56 to interfere with the substrate 51 as a work.

Then, it is conceivable to cut off a portion of each of the flange-like supporting members 54 which may interfere with the substrate 51. However, this case is not preferable since there may arise a problem in that each of the flange-like supporting members 54 becomes asymmetrical with respect to its central axis and hence a longitudinal wave (a wave in a direction A in FIG. 13) cannot be excited for the resonator 53.

In addition, in the ultrasonic bonding apparatus 60 shown in FIG. 14, in order to allow the pin-like supporting portions 67 to withstand a depressing force caused by the pressurizing mechanism 62, a diameter of each of the supporting portions 67 needs to be made large to some degree.

However, if the diameter of each of the supporting portions 67 is made large, there is a possibility that a portion which is separate from the vibrating member 63 and thus does not vibrate is necessarily provided in a portion of the vibrating member 63 in which a node of a vibration wave is generated, i.e., the excitation of the vibrating member 63 is impeded because of an increase in cross-sectional area of the supporting portion 67.

In addition, in the conventional ultrasonic bonding apparatus in which the leg portions of the depressing portion are fixed to the vibrating portion through the screw cramp, there is a possibility that the screw cramp portions between the leg portions of the depression member and the vibrating member impede the excitation of the vibrating portion.

When the vibration generated in the vibrating member is impeded, there arises a problem in that the quality of the bonding between the electronic component 52 and the substrate 51 is lowered.

The present invention has been made in the light of those problems, and it is, therefore, an object of the present invention to provide a resonator which is capable of suppressing that supporting portions through which leg portions of a depressing member and a vibrating member are coupled to each other impede vibrations of the vibrating member, thereby enhancing bonding quality, an ultrasonic bonding head, and an ultrasonic bonding apparatus.

In order to solve the above problems, the present invention adopts the following measures.

(1) That is, a resonator according to the present invention includes:

a vibrating member for, in order to join a second member to be joined to a first member to be joined, holding the second member to be joined and applying a vibration to the second member to be joined; and a depressing member applying a depressing force to the second member to be joined, which in-turn applies it to side of the first member to be joined, which through the vibrating member, wherein:

the depressing member has: leg portions which are disposed so as to leave spaces between the leg portions and both side faces of the vibrating member parallel with a vibration direction; and supporting portions through which the leg portions and the side faces of the vibrating member are to be coupled to each other;

each of the leg portions and the supporting portions is provided per one side face of the vibrating member by two or more; and with respect to a size of a section of each of the supporting portions parallel with the side face of the vibrating member, a length along the vibration direction of the vibrating member is shorter than that along a depressing direction of the depressing member.

In the resonator of the present invention, of sizes in the cross section of each of the supporting portions through which the leg portions of the depressing member and the vibrating member are coupled to each other, the length along the depressing direction is made long, thereby allowing the strength against the depressing force to be ensured, and the length along the vibration direction is made short, thereby making it possible to suppress that the supporting portions impede the vibrations of the vibrating member.

As a result, even when a frequency of the ultrasonic wave to be applied to the resonator is made high, it is possible to obtain a uniform vibration state of the resonator.

(2) Further, a resonator according to the present invention includes:

a vibrating member, in order to join a second member to be joined to a first member to be joined, holding the second member to be joined and applying a vibration to the second member to be joined; and a depressing member applying a depressing force to the second member to be joined, which in-turn applies it to the side of the first member to be joined, through the vibrating member, wherein:

the depressing member includes: leg portions which are disposed so as to leave spaces between the leg portions and both side faces of the vibrating member parallel with a vibration direction; and supporting portions through which the leg portions and the side faces of the vibrating member are to be coupled to each other;

each of the leg portions and the supporting portions is provided substantilly at the center of a length of the vibrating member in the vibration direction per one side face of the vibrating member by one;

openings which having a section of a top portion and a base portion, the top portion being formed of an upper oblique side and a lower oblique side, the top portion being directed toward end portion side of the vibrating member so as to face in opposite directions from one another are respectively formed on both sides of a coupling portion in the vibrating member between the vibrating member and the supporting portions; and with respect to a size of a section of each of the supporting portions parallel with the side face of the vibrating member, a length along the vibration direction of the vibrating member is shorter than that along a depressing direction of the depressing member.

When the vibrating member of the resonator is excited by an ultrasonic oscillator, a vibration wave travels through the vibrating member in the same direction as the traveling direction of the ultrasonic wave. At this time, a peak portion of the wave, i.e., a portion having a maximum amplitude is generated in a central portion of the vibrating member.

In the present invention, the openings having a section of a top portion and a base portion, the top portion being formed of an upper oblique side and a lower oblique side, the top portion being directed toward the end portion side of the vibrating member are provided on both sides of the supporting portion through which the central portion of the vibrating member in the vibration direction and the leg portions provided in the depressing member are coupled to each other. Here, a vibration wave which has traveled from a side of an ultrasonic oscillating device connected to one end portion of the vibrating member toward the other end portion of the vibrating member is branched at the top portion of one of the openings to travel vertically along oblique sides on both sides of that opening.

Then, when the vibration wave which has traveled along the upper oblique side of that opening reaches a portion between the openings, i.e., the central portion of the vibrating member, a part of the vibration wave travels downward along a base portion of that opening. In addition, a part of the vibration wave which has traveled along the lower oblique side of that opening travels upward along the base portion of that opening from the central portion of the vibrating member.

As a result, the vibration wave which has traveled downward at the central portion of the vibrating member, and the vibration wave which has traveled upward from the central portion of the vibrating member cancel each other to reduce the amplitude of the vibration wave. Consequently, since the force required to support the central portion of the vibrating member becomes small, the central portion of the vibrating member can be surely supported by one supporting portion. In addition, a cross-sectional area of the supporting portion can be reduced.

(3) The above supporting portion is preferably formed so as to have a rectangular configuration or an elliptic configuration in section. In this case, the supporting portion becomes easy to form.

(4) An ultrasonic bonding head, including at least a resonator including: a vibrating member, in order to join a second member to be joined to a first member to be joined, holding the second member to be joined and applying a vibration to the second member to be joined; and a depressing member applying a depressing force to the second member to be joined, which in-turn applies it to side of the first member to be joined, through the vibrating member, wherein the depressing member includes: leg portions which are disposed so as to leave spaces between the leg portions and both side faces of the vibrating member parallel with a vibration direction; and supporting portions through which the leg portions and the side faces of the vibrating member are to be coupled to each other, each of the leg portions and the supporting portions is provided per one side face of the vibrating member by two or more, and with respect to a size of a section of each of the supporting portions parallel with the side face of the vibrating member, a length along the vibration direction of the vibrating member is shorter than that along a depressing direction of the depressing member, the ultrasonic bonding head being characterized by further including:

an ultrasonic wave generating device for applying an ultrasonic wave to the vibrating member to cause the vibrating member to vibrate.

(5) An ultrasonic bonding apparatus according to the present invention includes:

at least a resonator including: a vibrating member, in order to join a second member to be joined to a first member to be joined, holding the second member to be joined and applying a vibration to the second member to be joined; and a depressing member applying a depressing force to the second member to be joined, which in-turn applies it to the side of the first member to be joined, through the vibrating member, wherein the depressing member includes: leg portions which are disposed so as to leave spaces between the leg portions and both side faces of the vibrating member parallel with a vibration direction; and supporting portions through which the leg portions and the side faces of the vibrating member are to be coupled to each other, each of the leg portions and the supporting portions is provided per one side face of the vibrating member by two or more, and with respect to a size of a section of each of the supporting portions parallel with the side face of the vibrating member, a length along the vibration direction of the vibrating member is shorter than that along a depressing direction of the depressing member, the ultrasonic bonding apparatus further including:

an ultrasonic bonding head including an ultrasonic wave generating device for applying an ultrasonic wave to the vibrating member to cause the vibrating member to vibrate;

a pressurizing device for pressurizing the depressing member in the ultrasonic bonding head to a side of the vibrating member;

a stage for supporting the first member to be joined;

a stage moving portion for horizontally moving the stage in two directions intersecting perpendicularly to each other and for rotating the stage; and a position displacement detecting device for detecting position displacement between the first member to be joined and the second member to be joined supported by the ultrasonic bonding head.

With this ultrasonic bonding apparatus, for example, when an electronic component is joined to a substrate, it is possible to enhance the bonding quality.

EFFECTS OF THE INVENTION

As set forth hereinabove, according to the resonator and the ultrasonic bonding head of the present invention, since each of the supporting portions through which the vibrating portion and the leg portions of the depressing member are coupled to each other is formed so as to have predetermined size and shape in cross section, it is possible to suppress that the supporting portions impede the vibrations of the vibrating member. In addition, according to the ultrasonic bonding apparatus of the present invention, since the above resonator and ultrasonic bonding head are used, it is possible to enhance the bonding quality.

DETAIL DESCRIPTION OF THE INVENTION

First Embodiment

Figure 1:
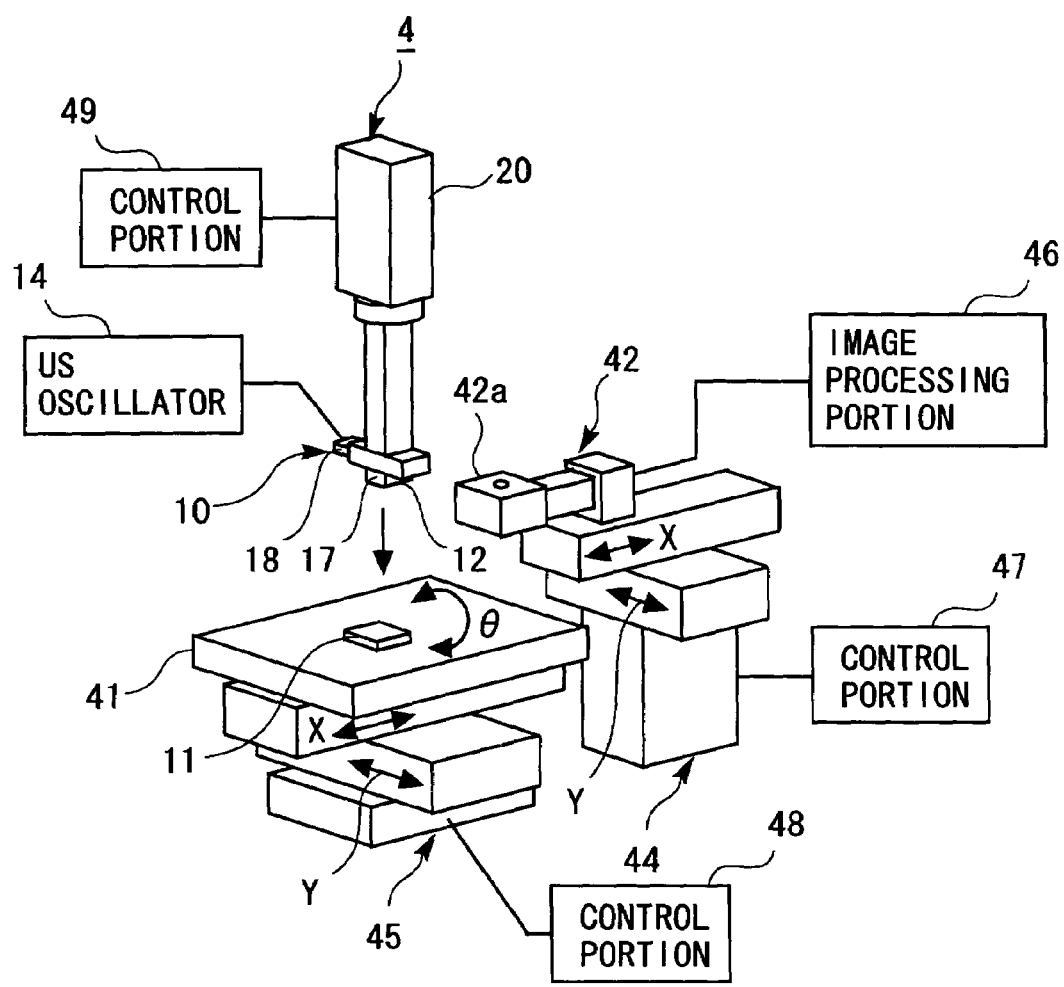
FIG. 1 is a perspective view showing an ultrasonic bonding apparatus of a first embodiment mode according to the present invention.

FIG. 1 shows an ultrasonic bonding apparatus 4 of a first embodiment mode. The ultrasonic bonding apparatus 4 has: a stage 41 on which a substrate 11 is to be placed and held; an ultrasonic bonding head 10 for bonding an electronic component 12 to the substrate 11 placed on the stage 41 using an ultrasonic wave; an ultrasonic wave generating device 14 connected to the ultrasonic bonding head 10; a pressurizing mechanism portion 20 for depressing the ultrasonic bonding head 10 against the substrate 11 side; an image pickup unit 42 as a position displacement detecting device for detecting position displacement between the substrate 11 and the electronic component 12 disposed right above the substrate 11; an image pickup unit moving portion 44 for moving the image pickup unit 42 in XY directions; and a stage moving portion 45 for horizontally moving the stage 41 in the XY directions and rotating the stage 41 in a E direction based on the position displacement detection results from the image pickup unit 42.

A camera 42a for capturing images of the electronic component 12 and the substrate 11 is provided in the image pickup unit 42. In addition, an image processing portion 46 is connected to the image pickup unit 42.

Control portions 47, 48, and 49 are connected to the image pickup unit moving portion 44, the stage moving portion 45, and the ultrasonic bonding head 10, respectively. In addition, the image processing portion 46, and the control portions 47, 48, and 49 are controlled by a main controller (not shown).

Figure 2:
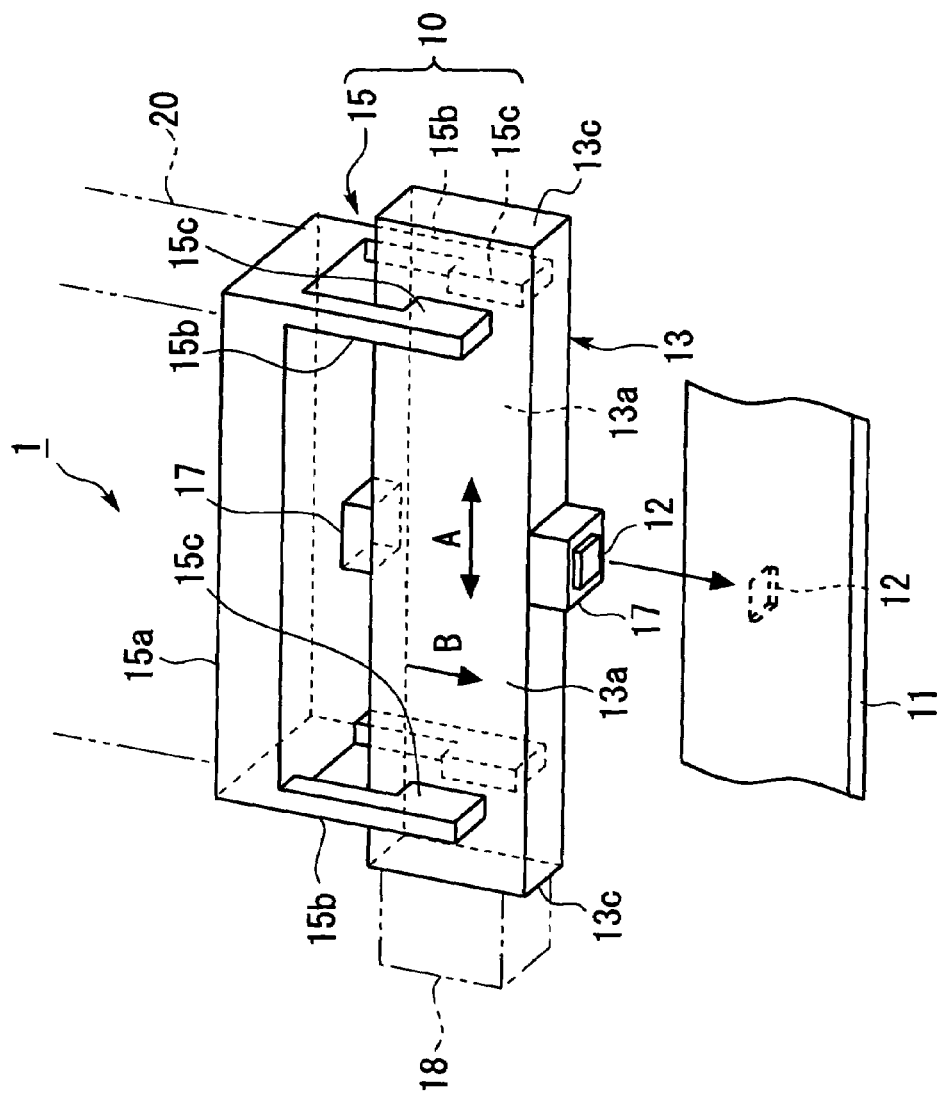
FIG. 2 is a perspective view showing a resonator and an ultrasonic bonding head of the first embodiment mode according to the present invention.

Next, the above ultrasonic bonding head 10 will be described. The ultrasonic bonding head 10, as shown in FIG. 2, includes a resonator 1, and a vibrator 18 for causing the resonator 1 to generate vibrations. The above ultrasonic wave generating device 14 is connected to the vibrator 18.

The resonator 1, in order to join the electronic component 12 as a second member to be joined to the substrate 11 as a first member to be joined, includes a vibrating member 13 for holding the electronic component 12 and for applying vibrations to the electronic component 12, and a depressing member 15 for applying a depressing force for the substrate 11 side to the above electronic component 12 through the vibrating member 13.

The above vibrating member 13 is formed in rectangular parallelepiped-like shape which is long from side to side. Sucking tool members 17, 17 for sucking and holding the electronic component 12 are provided nearly in central portions of upper and lower surfaces of the vibrating member 13 so as to project therefrom.

The above depressing member 15 is formed in gate-like shape by a relatively thick rectangular parallelepiped-like main body 15*a*, and four long portions 15*b* extending toward the vibrating member 13 side from respective corner portions in both end portions of the main body 15*a*.

Figure 3:
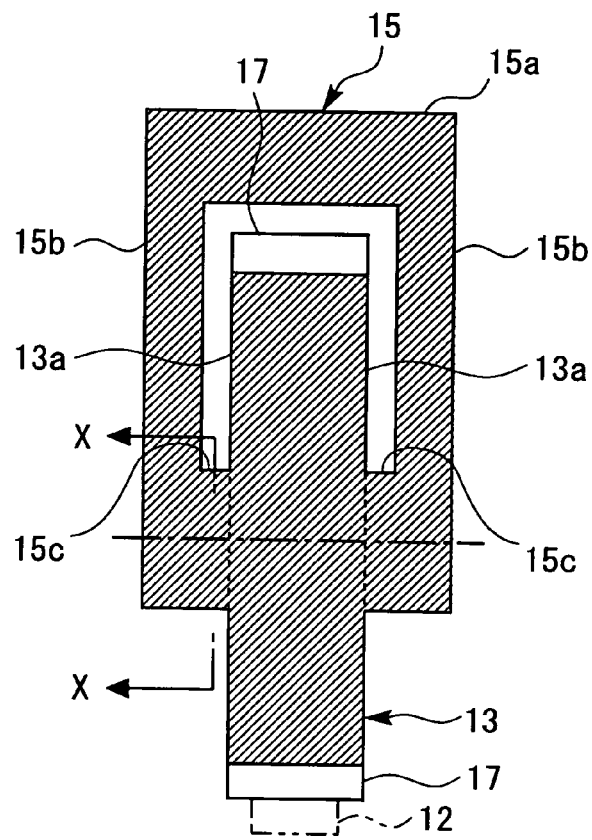
FIG. 3 is a cross sectional view showing a vibrating member of the first embodiment mode according to the present invention.

The leg portions 15*a* of the depressing member 15, as shown in FIG. 3, are disposed so as to leave spaces between the leg portions 15*a* and both side faces 13*a*, 13*a* of the vibrating member 13 parallel with a vibration direction A. In addition, those leg portions 15*b* are coupled integrally with the respective side faces 13*a* of the vibrating member 13 through respective supporting portions 15*c*.

As shown in FIG. 2 the leg portions 15*b* and the supporting portion 15*c* are provided per side face 13*a* of the vibrating member 13 by equal to or more than two, and two legs and two supporting portions are provided in this embodiment. Note that when the electronic component 12 is joined to the substrate 11 using the ultrasonic wave, the depressing member 15 is pressurized against the substrate 11 side by the pressurizing mechanism portion 20 as pressurizing device.

Figure 4:
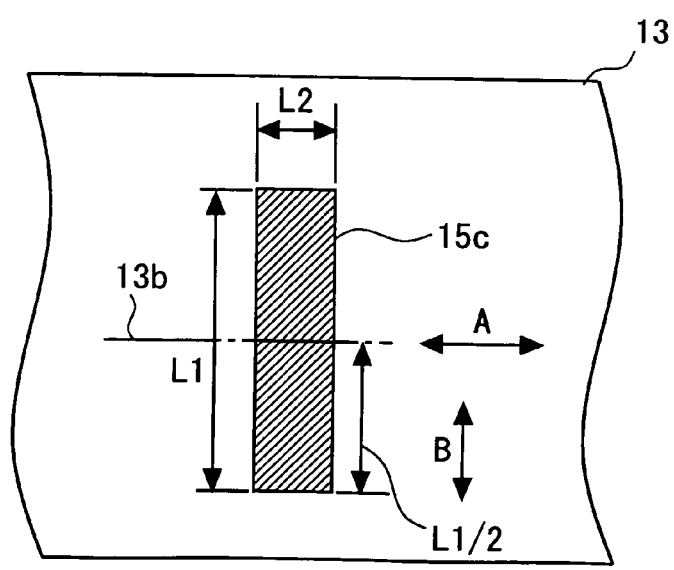
FIG. 4 is a cross sectional view, taken along line X-X of FIG. 3, showing a shape of a supporting portion of the first embodiment mode according to the present invention.

As shown in FIG. 4, the supporting portion 15*c* is formed so as to have a longitudinal rectangular configuration in cross section parallel with the side face 13*a* of the vibrating member 13. That is, the supporting portion 15*c* is formed so that its transverse length (a length extending along the vibration direction A of the vibrating member 13) L2 is shorter than its longitudinal length (a length extending along a depressing direction B of the depressing member 15) L1.

In addition, the supporting portion 15*c* is disposed so that its longitudinal length L1 is nearly equally divided between both sides with a horizontal central line 13*b* of the vibrating member 13 as a center.

Figure 5:
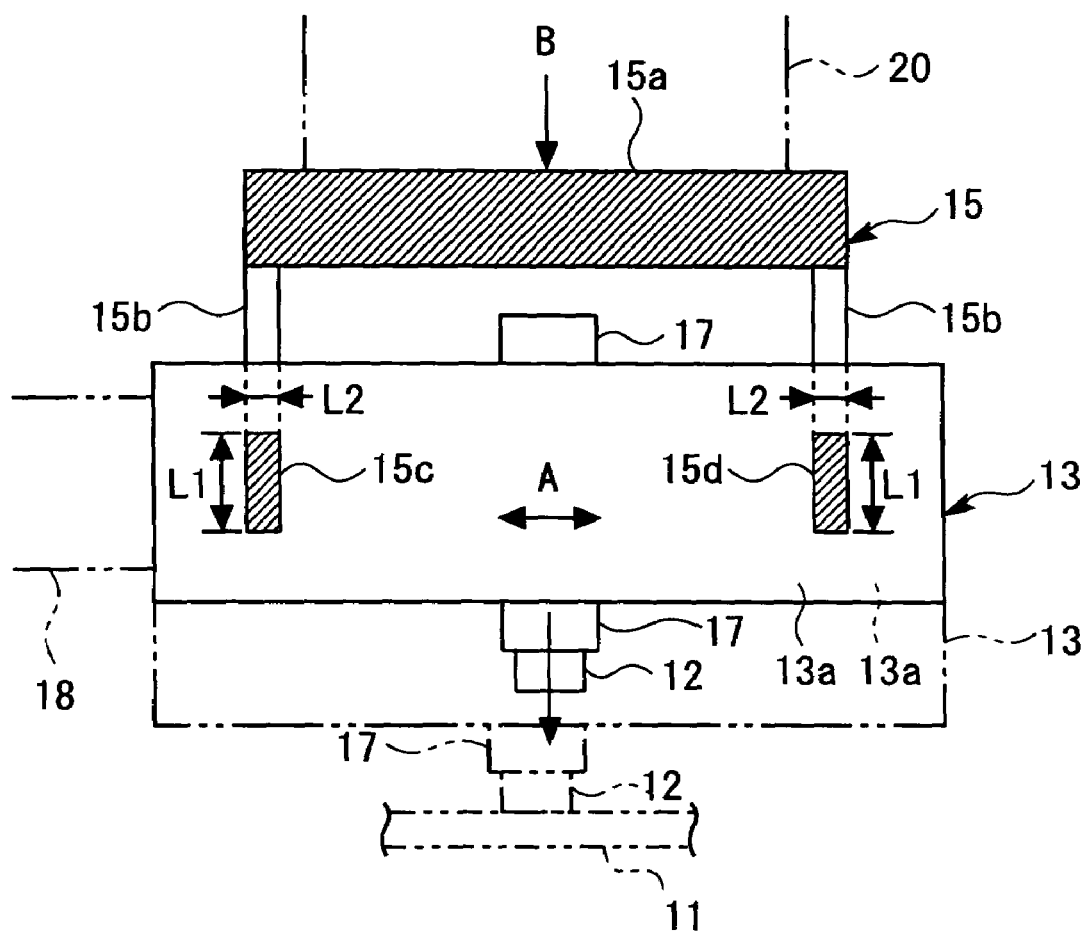
FIG. 5 is a view explaining an operation of the first embodiment mode according to the present invention.

Next, an operation of the resonator 1 will be described. When the electronic component 12 as the second number to be joined is joined to the substrate 11 as the first member to be joined using the ultrasonic wave by the resonator 1, as shown in FIG. 5, the electronic component 12 is sucked and held by the sucking tool portion 17 of the vibrating member 13. In this case, the depressing member 15 is pressurized against the substrate 11 side (in a direction B) by the pressurizing mechanism portion 20.

As a result, as shown in FIG. 5 by a two-dot chain line, the depressing member 15, the vibrating member 13, the sucking tool portion 17, and the electronic component 12 descend to the substrate 11 side, and thus the electronic component 12 is brought into contact with the substrate 11. Moreover, the depressing member 15 is pressurized to the substrate 11 side by the pressurizing mechanism portion 20, and thus the electronic component 12 is depressed against the substrate 11 side by a predetermined force.

Next, the ultrasonic wave is applied from the ultrasonic wave generating device 14 to the vibrator 18. As a result, the vibrator 18 is caused to vibrate, and the vibrating member 13 vibrates in a direction A nearly intersecting perpendicularly the above depressing direction B. Thus, the electronic component 12 also vibrates in the direction A, and friction is caused between bumps (not shown) of the electronic component 12 and terminals (not shown) of the terminal 11. As a result, oxide films of the bonding surfaces between the bumps (not shown) of the electronic component 12 and the terminals (not shown) of the terminal 11 are removed. In this state, the metal diffusion is caused, whereby the bumps of the electronic component 12 are bonded solid phase reaction to the terminals of the substrate 11.

On this occation, in the resonator 1, each of the supporting portions 15*c* through which the leg portions 15*b* of the depressing member 15 and the side faces 13 of the vibrating member 13 are coupled to each other is formed longitudinally in size of the cross section. Thus, as will be described below, it is possible to suppress that the supporting portions 15*c* impede the vibrations of the vibrating member 13.

Figure 6:
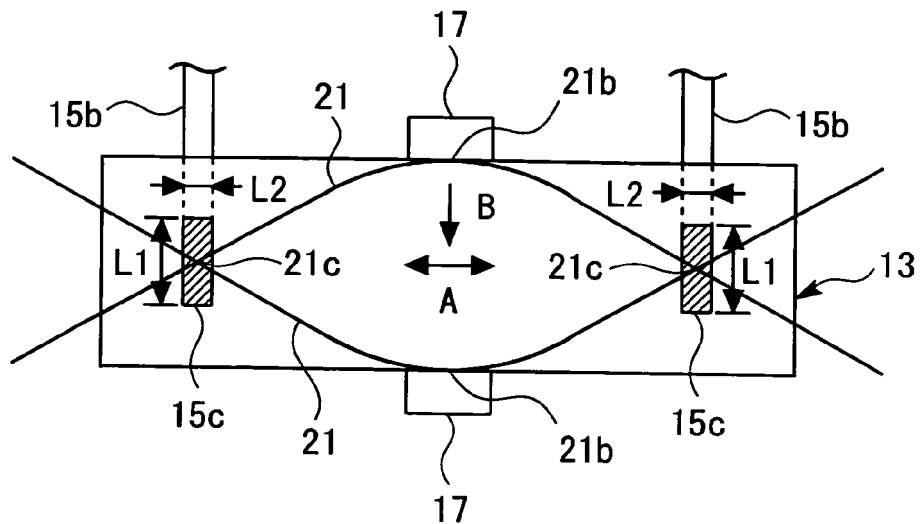
FIG. 6 is a view explaining the operation of the first embodiment mode according to the present invention and explaining a mode of a vibration wave.

That is, in the resonator 1, as shown in FIG. 6, the supporting portions 15*c* as portions corresponding to nodes 21*c* of the vibration wave 21 in the vibrating member 13 are coupled to the nodes 21*c* of the vibration wave 21 in the vibrating member 13, respectively. In addition, in order to prevent the vibrations from being impeded, the connection length in the vibration direction is desirably set as short as possible. In particular, as the frequency becomes higher, the loss becomes larger unless the connection length of each of the supporting portions 15*c* in the vibration direction is reduced.

In addition, with respect to a cross-sectional size of each of the supporting portions 15*c*, the length L2 along the vibration direction A is set considerably shorter than the length L1 along the depressing direction (pressurization direction) B of the depressing member 15. As a result, it is possible to suppress that the supporting portions 15*c* impede the vibrations of the vibrating member 13 in the vibration direction A.

Note that with respect to the length L2 of each of the supporting portions 15*c* along the vibration direction A of the vibrating member 13, the longitudinal length and the length in the vibration direction are determined so that the supporting portions 15*c* can withstand an applied load or moment while as a matter of course, it is taken into consideration that the length in the vibration direction is set as small (short) as possible.

In addition, in this embodiment mode, the supporting portions 15*c* are respectively disposed in the portions corresponding to the nodes 21*c* of the vibration wave 21 generated in the vibrating member 13. However, the supporting portions 15*c* may be slightly displaced in position from the portions corresponding to the nodes 21*c* of the vibrating member 13.

Also, in the resonator 1, the length L1 of each of the supporting portions 15*c* extending along the depressing direction (pressurization direction) B of the depressing member 15 is set much longer than the length L2 of each of the supporting portions 15*c* extending along the vibration direction A. In other words, each of the lengths of the bonding portions between the vibrating member 13 and the supporting portions 15*c* in the depressing direction of the depressing member 15 is long. As a result, the load resistance in the depressing direction B of each of the supporting portions 15*c* becomes large.

The longitudinal length L1 of each of the above supporting portions 15*c* is set to a length with which each of the supporting portions 15*c* can withstand the pressurization force applied from the pressurizing mechanism portion 20.

Moreover, in the above embodiment, the description has been given with respect to the case where the vibrating member 13, the depressing member 15, the leg portions 15*b*, and the supporting portions 15c are formed integrally with one another. However, the vibrating member 13 and the depressing member 15 can be formed separately from each other, and the supporting portions 15c for the leg portions 15b can be coupled to the side faces 13a of the vibrating member 13 by a coupling device, respectively.

In addition, holes each analogous in shape to each of the supporting portions 15c are formed in the side faces 13a of the vibrating member 13, and the supporting portions 15c provided in the leg portions 15b of the depressing member 15 are inserted into those holes, respectively, thereby allowing the vibrating member 13 and the depressing member 15 to be coupled to each other.

According to the ultrasonic bonding apparatus 4 using the resonator 1 and the ultrasonic bonding head 10, the bonding between the electronic component 12 and the substrate 11 becomes possible by utilizing the high frequency ultrasonic vibration, and the enhancement of the bonding quality and the shortening of the bonding time period become possible. In addition, the miniaturization of the ultrasonic bonding head 10 makes it possible to miniaturize and lighten the pressurizing mechanism portion 20. Thus, it is possible to realize the miniaturization, the high speed operation, and the low cost as the entire apparatus.

Figure 7:
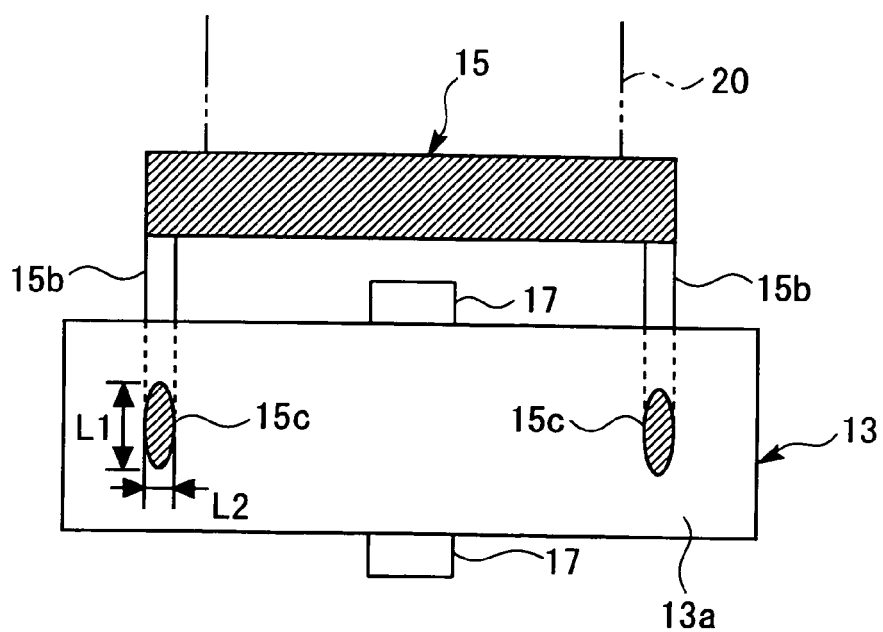
FIG. 7 is a view showing a change of the supporting portion of the first embodiment mode according to the present invention.

In the above embodiment, each of the supporting portions 15c has the rectangular configuration in cross section. As shown in FIG. 7, each of the supporting portions 15c can be formed so as to have an elliptic configuration in cross section, and can also be formed so as to have various longitudinal configurations in cross section in addition thereto.

Second Embodiment

Figure 8:
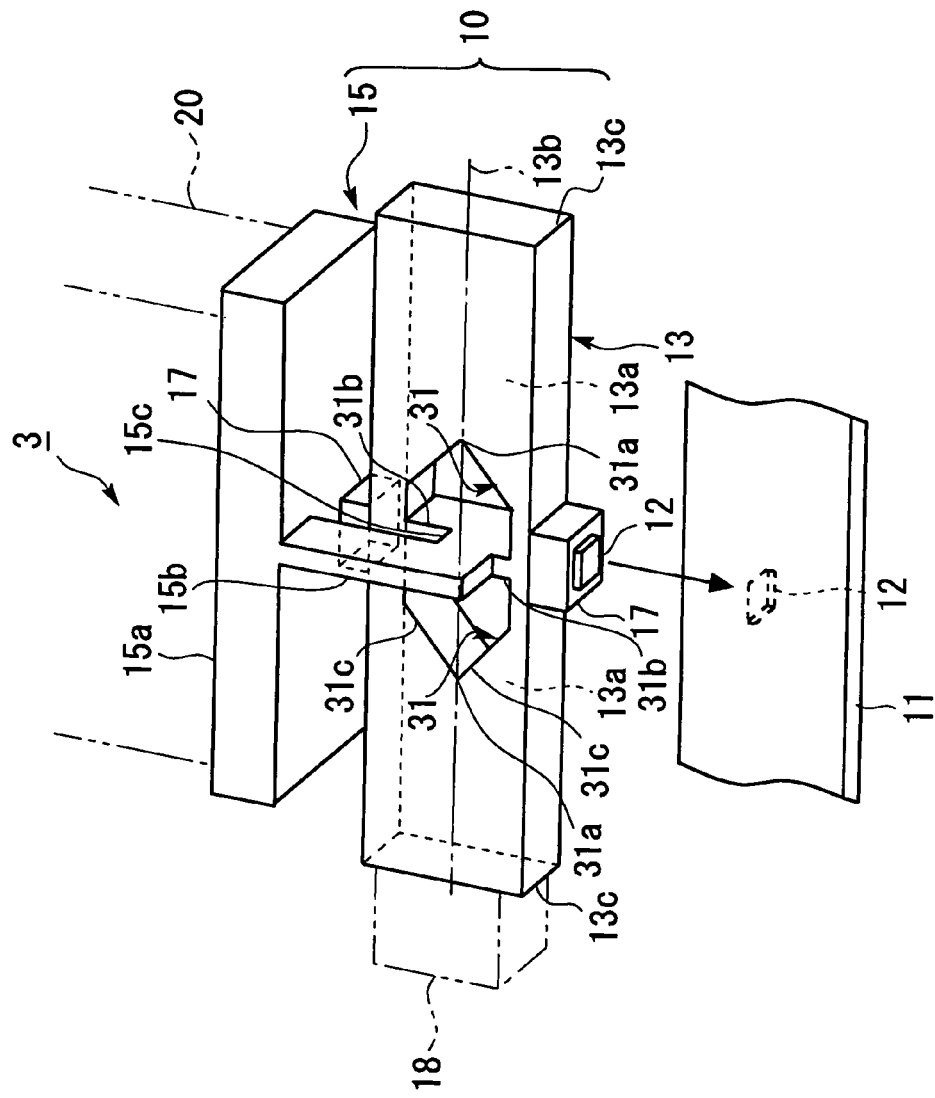
FIG. 8 is a perspective view showing a resonator and an ultrasonic bonding head of a second embodiment mode according to the present invention.
Figure 9:
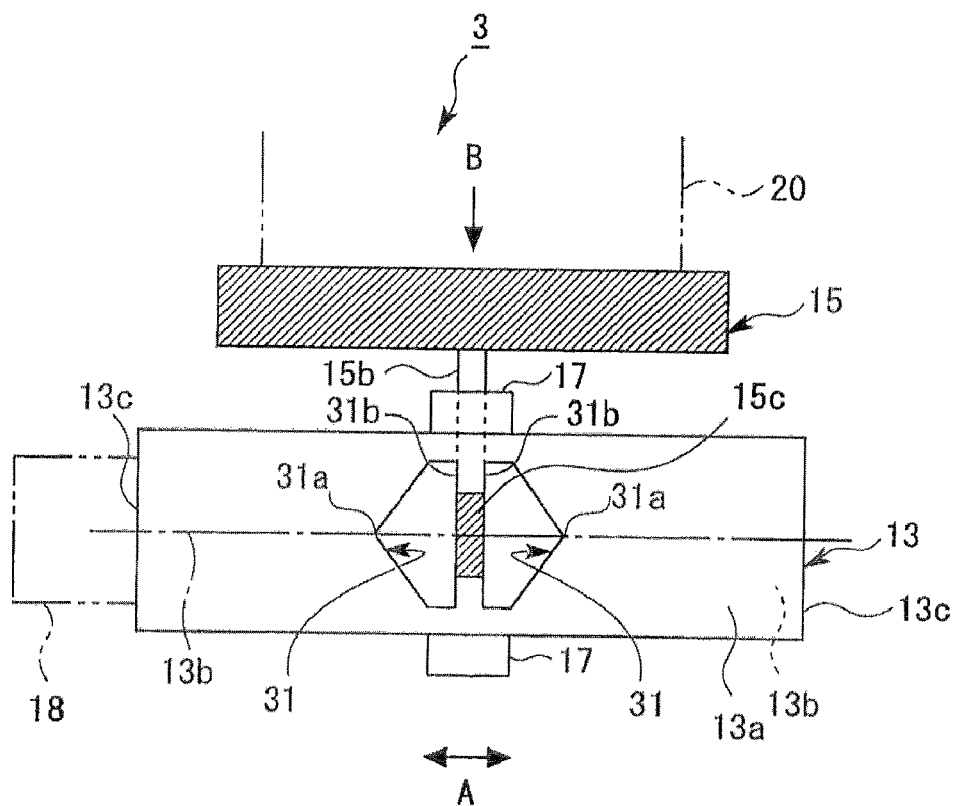
FIG. 9 is a view showing a supporting portion and openings of the second embodiment mode according to the present invention.

FIGS. 8 and 9 show a resonator 3 of a second embodiment mode according to the present invention. This resonator 3 can be used instead of the resonator 1 used in the ultrasonic bonding head 10 and the ultrasonic bonding apparatus 4. Note that the same constituent elements as those in the resonator 1 of the first embodiment mode are designated with the same reference numerals, and their detailed descriptions are omitted.

In the resonator 3, a pair of leg portions 15b, 15b (only one of a pair of leg portions 15b, 15b is illustrated) are provided on both side face sides nearly in a center of the depressing member 15. A pair of leg portions 15b, 15b are so disposed that the vibrating member 13 is hold between the leg portions 15b, 15b and so as to leave spaces between the leg portions 15b, 15b and the side faces 13a of the vibrating member 13.

In addition, lower end portions of the leg portions 15b, 15b are coupled to the side faces 13a of the vibrating member 13 through the supporting portions 15c, 15c, respectively.

Openings 31, 31 each of which has an angle-like shape, or a deformed pentagon-like shape in this embodiment mode and which are located on both sides of the above supporting portion 15c, are provided in the vibrating member 13. Top portions 31a, 31a of, each having the angle-like shape, of the openings 31, 31 are disposed on a horizontal central line 13b of the vibrating member 13 toward side ends 13c, 13c of the vibrating member 13. In addition, base portions 31b, 31b of the openings 31, 31 are disposed along the supporting portion 15c. In other words, the openings 31, 31 on both sides are disposed so as to face in the opposite directions.

Figure 10:
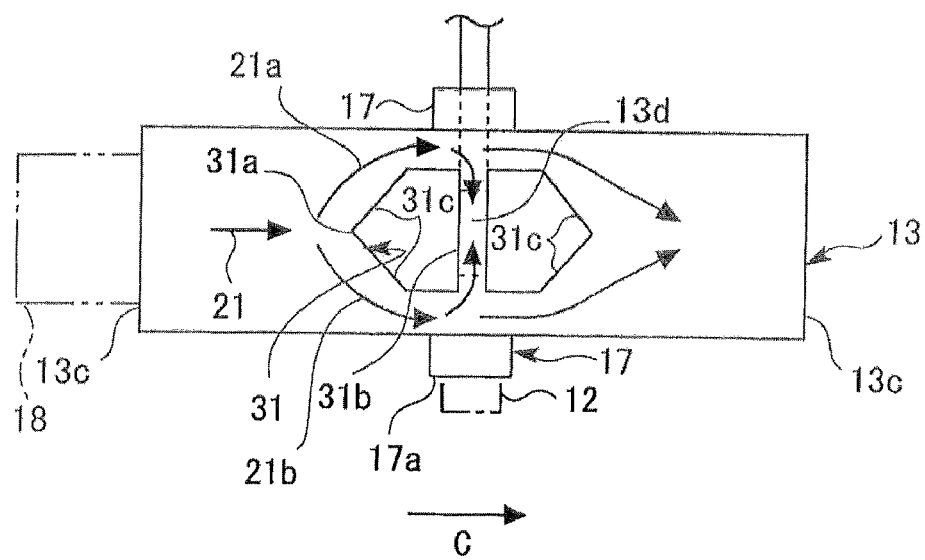
FIG. 10 is a view explaining a traveling direction of a vibration wave generated in the resonator of the second embodiment mode according to the present invention.

In the resonator 3, as shown in FIG. 10, when an ultrasonic wave is applied from the vibrator 18 to the vibrating member 13, a vibration wave travels toward a side (in a direction D) opposite to the vibrator 18.

The vibration wave 21 is branched vertically at the top portion 31a of the opening 31 on the side of the vibrator 18, and vibration waves 21a, 21b obtained through the branching travel vertically along oblique sides 31c, 31c of that opening 31.

Then, when the vibration waves 21a, 21b obtained through the branching reach the portions between the openings 31, 31 on both sides, a part of the vibration wave 21a which has traveled upward travels downward between the openings 31, 31, while a part of the vibration wave 21b which has traveled downward travels upward between the openings 31, 31.

Then, a part of the vibration wave 21a traveling downward between the openings 31, 31 and a part of the vibration wave 21b traveling upward cancel each other.

Thus, only one portion nearly in the center of the vibrating member 13 is coupled to the depressing member 15 through the supporting portion 15c and the leg portions 15b, thereby allowing the vibrating member 13 to be surely supported. In addition, since the amplitude of the vibration wave is essentially small in a portion 13d between the openings 31, 31, even when the portion 13d is supported by the supporting portion 15c, an influence exerted on the vibrations of the vibrating member 13 is small, and hence there is no problem.

By holding the central portion of the vibrating member 13 by the depressing member 15 through the supporting portion 15c and the leg portions 15b in such a manner, when the ultrasonic bonding is carried out, the sucking tool portion 17 provided in the central portion of the vibrating member 13 is depressed from right above. Hence, the deformation of the vibrating member 13 can be prevented.

As a result, when the frequency of the ultrasonic wave applied to the vibrating member 13 is increased up to equal to or higher than 150 kHz for example, the uniform vibration state of the vibrating member 13 can be obtained against the shortening of the wavelength of the ultrasonic wave. In addition, a size of a tool surface 17c of the sucking tool portion 17 can be enlarged.

Figure 11:
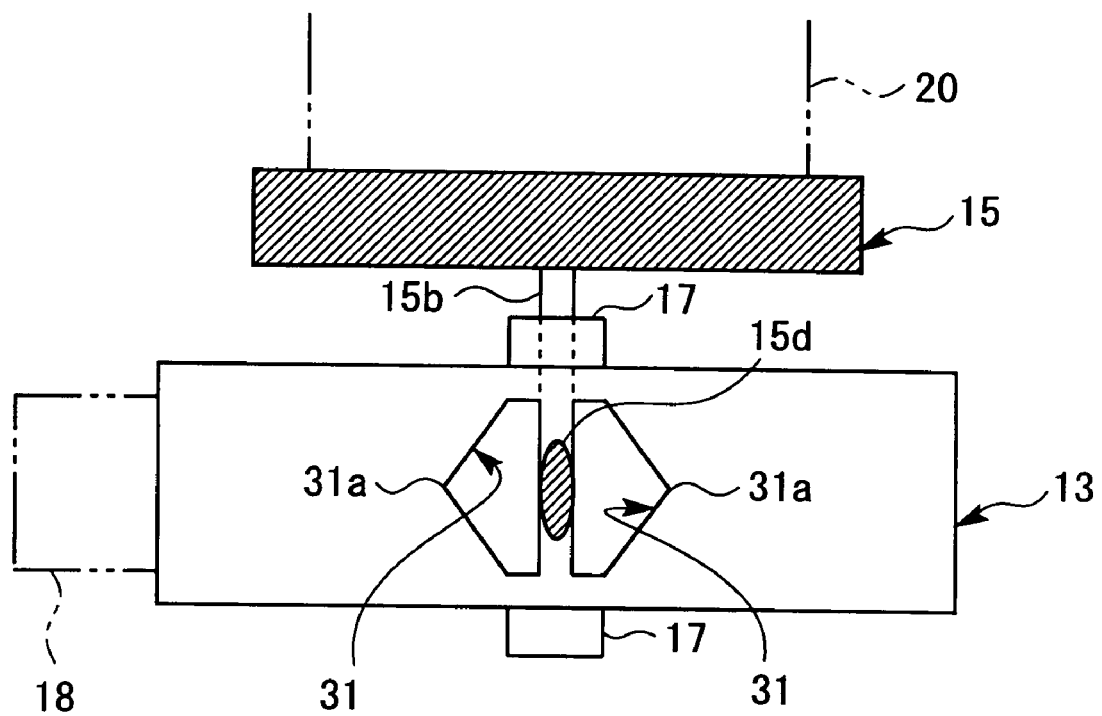
FIG. 11 is a view showing a change of the supporting portion of the second embodiment mode according to the present invention.

In the above embodiment, the supporting portion 15c is formed so as to have the longitudinal rectangular configuration. As shown in FIG. 11, the supporting portion 15c can be formed so as to have a longitudinal elliptic configuration. In addition, the supporting portion 15c can be formed so as to have a longitudinal arbitrary configuration.

Figure 12:
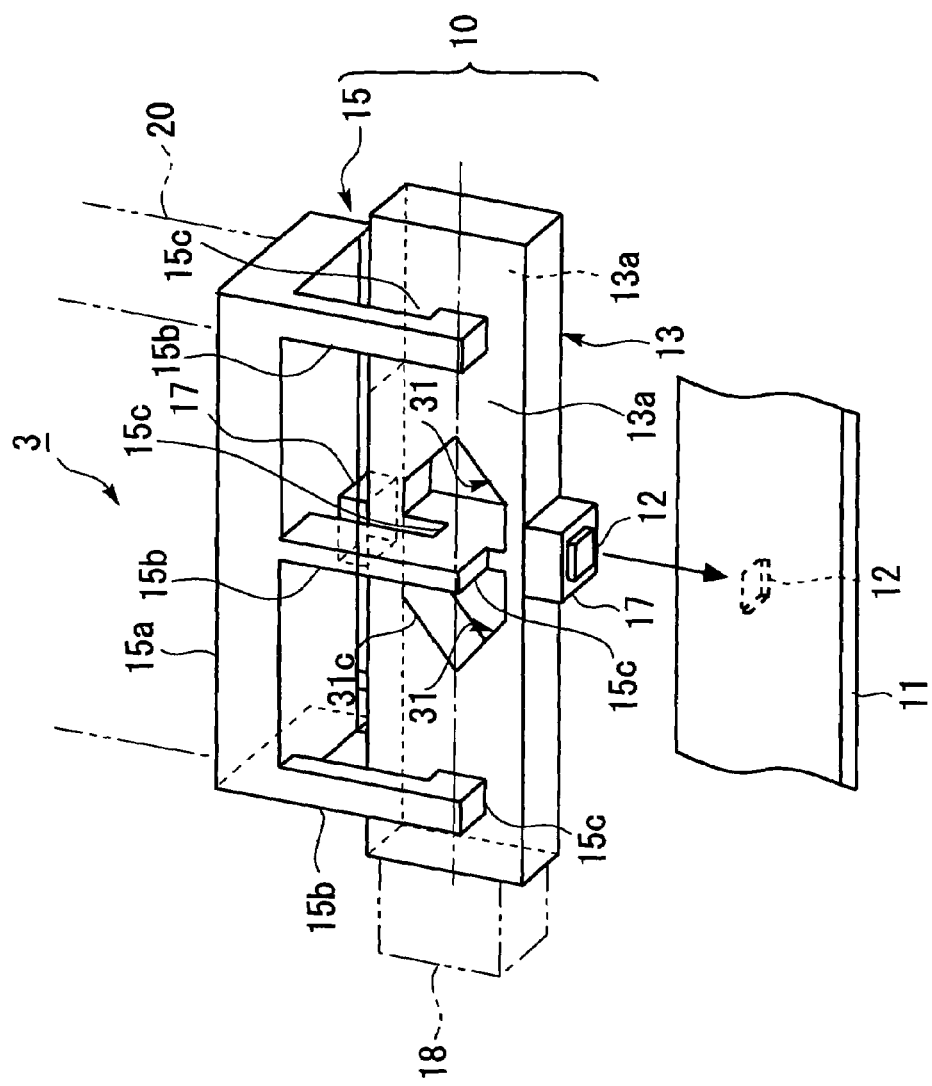
FIG. 12 is a perspective view showing a change of the resonator of the second embodiment mode according to the present invention.
Figure 13:
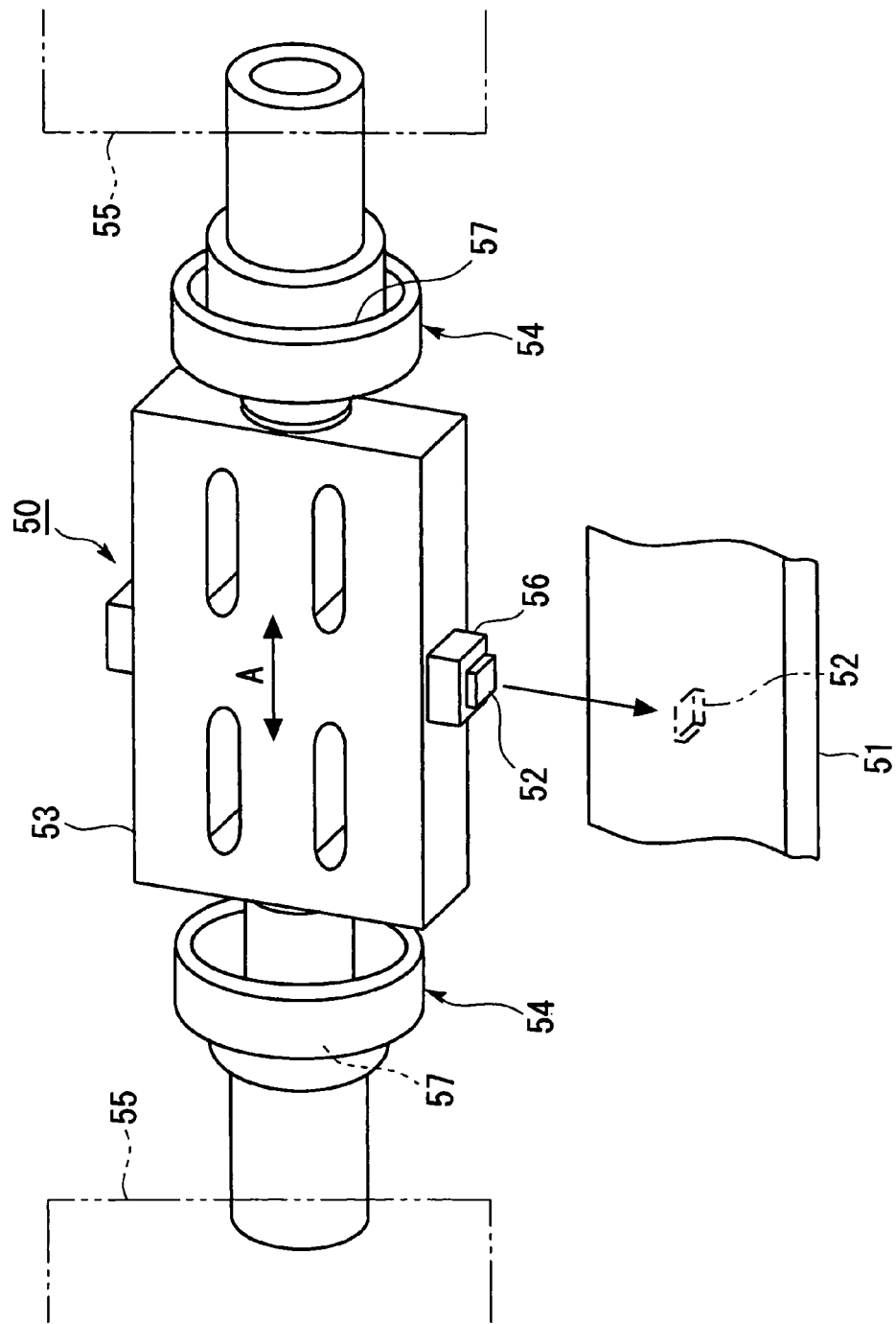
FIG. 13 is a perspective view showing an ultrasonic bonding apparatus according to a related art.
Figure 14:
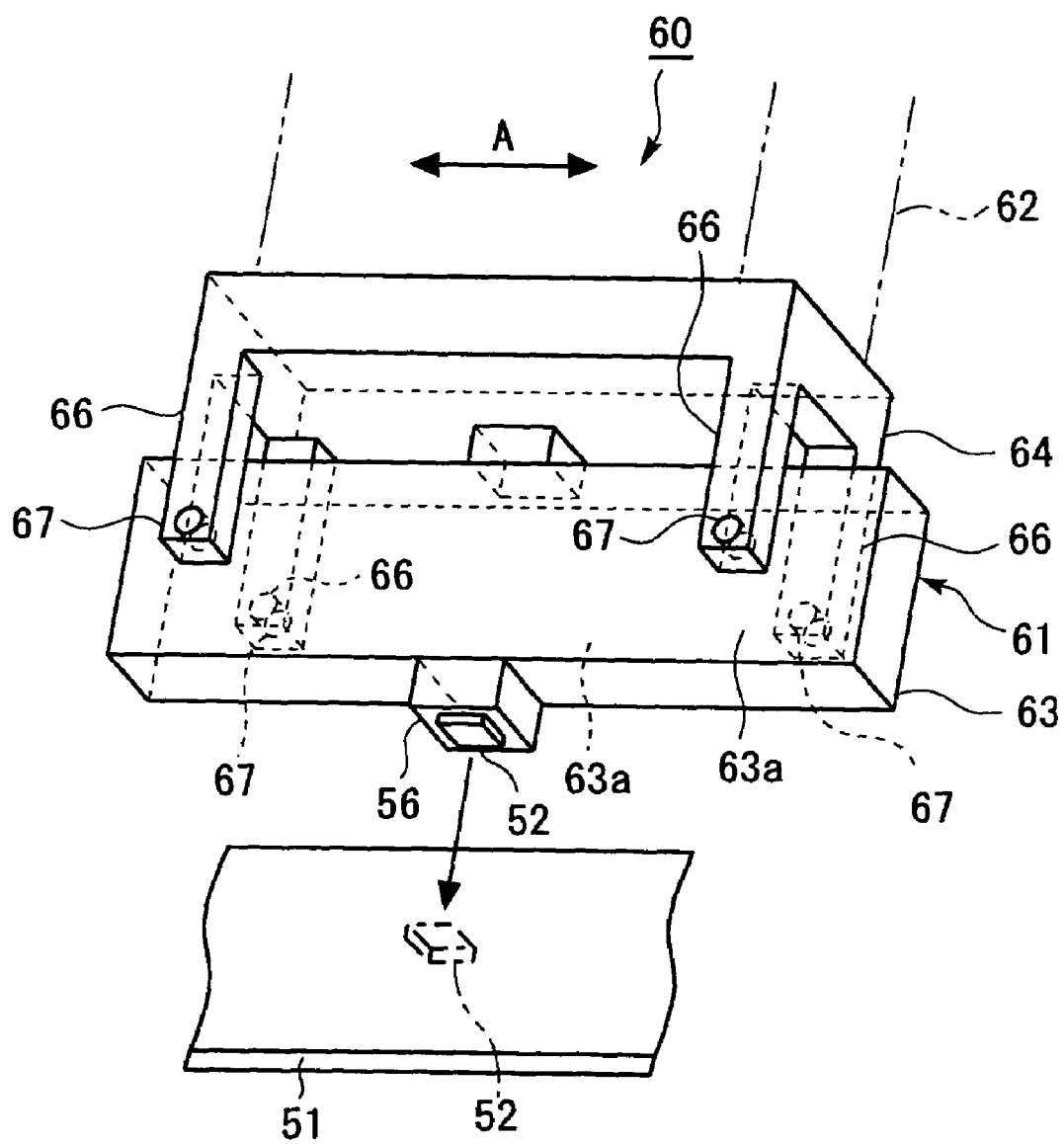
FIG. 14 is a perspective view showing another ultrasonic bonding apparatus according to a related art.
Figure 15:
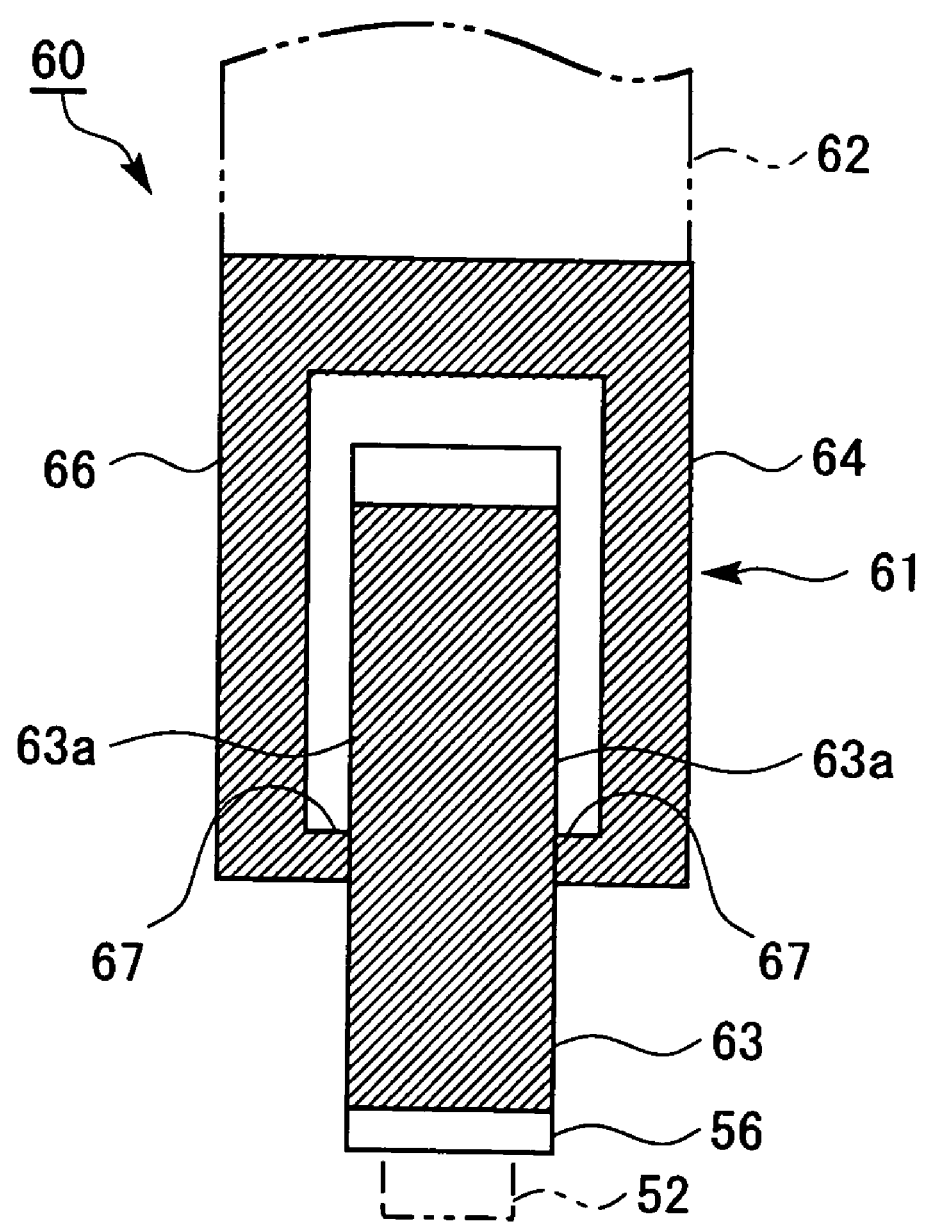
FIG. 15 is a cross sectional view of a vibrating member and a depressing member in the ultrasonic bonding apparatus of FIG. 14.

In addition, in the above embodiment, one leg portion 15b and one supporting portion 15c are provided nearly in the central portion of each of both side faces 13a of the vibrating member 13. However, as shown in FIG. 12, the leg portions 15b and the supporting portions 15c can be provided in both end portions and the central portion of each of both side faces 13a of the vibrating member 13. In this case, the vibrating member 13 can be more surely supported.

What is claimed is:
1. A resonator including:
   a vibrating member, in order to join a second member to be joined to a first member to be joined, holding the second member to be joined and applying a vibration to the second member to be joined; and
   a depressing member applying a depressing force to the second member to be joined, which in-turn applied it to the side of the first member to be joined, through the vibrating member, wherein:
   the depressing member includes: leg portions which are disposed so as to leave spaces between the leg portions and both side faces of the vibrating member parallel with a vibration direction; and supporting portions through which the leg portions and the side faces of the vibrating member are to be coupled to each other;

each of the leg portions and the supporting portions is provided substantially at the center of a length of the vibrating member in the vibration direction per one side face of the vibrating member by one;

two openings having a section of a top portion, a base portion, and a connecting portion connecting the top portion and the base portion, the top portion being formed of an upper oblique side and a lower oblique side, the top portion being directed toward the end portion side of the vibrating member so as to face in opposite directions from one another are respectively formed on both sides of a coupling portion in the vibrating member between the vibrating member and the supporting portions, and the connecting portion connecting the base portion to the upper oblique side and the lower oblique side; and the vibrating member is supported between the two openings by the supporting portion.

2. An ultrasonic bonding head, including at least:

a resonator including: a vibrating member, in order to join a second member to be joined to a first member to be joined, holding the second member to be joined and applying a vibration to the second member to be joined; and a depressing member applying a depressing force to the second member to be joined, which in-turn applies it to first member to be joined, through the vibrating member, wherein the depressing member includes: leg portions which are disposed so as to leave spaces between the leg portions and both side faces of the vibrating member parallel with a vibration direction; and supporting portions through which the leg portions and the side faces of the vibrating member are to be coupled to each other, each of the leg portions and the supporting portions is provided substantially at the center of a length of the vibrating member in the vibration direction per one side face of the vibrating member by one, two openings having a section of a top portion, a base portion, and a connecting portion connecting the top portion and the base portion, the top portion being formed of an upper oblique side and a lower oblique side, the top portion being directed toward the end portion side of the vibrating member so as to face in opposite directions from one another are respectively formed on both sides of a coupling portion in the vibrating member between the vibrating member and the supporting portions, and the connecting portion connecting the base portion to the upper oblique side and the lower oblique side, the vibrating member is supported between the two openings by the supporting portion, and the ultrasonic bonding head further including:

an ultrasonic wave generating device for applying an ultrasonic wave to the vibrating member to cause the vibrating member to vibrate.

3. An ultrasonic bonding apparatus, including at least:

a resonator including: a vibrating member, in order to join a second member to be joined to a first member to be joined, holding the second member to be joined and applying a vibration to the second member to be joined; and a depressing member applying a depressing force to the second member to be joined, which in-turn applies it to the first member to be joined, through the vibrating member, wherein the depressing member includes: leg portions which are disposed so as to leave spaces between the leg portions and both side faces of the vibrating member parallel with a vibration direction; and supporting portions through which the leg portions and the side faces of the vibrating member are to be coupled to each other;

each of the leg portions and the supporting portions is provided substantially at the center of a length of the vibrating member in the vibration direction per one side face of the vibrating member by one;

two openings having a section of a top portion, a base portion, and a connecting portion connecting the top portion and the base portion, the top portion being formed of an upper oblique side and a lower oblique side, the top portion being directed toward the end portion side of the vibrating member so as to face in opposite directions from one another are respectively formed on both sides of a coupling portion in the vibrating member between the vibrating member and the supporting portions; and the connecting portion connecting the base portion to the upper oblique side and the lower oblique side;

the vibrating member is supported between the two openings by the supporting portion; and the ultrasonic bonding apparatus further including:

an ultrasonic bonding head having an ultrasonic wave generating device for applying an ultrasonic wave to the vibrating member to cause the vibrating member to vibrate;

a pressurizing device for pressurizing the depressing member in the ultrasonic bonding head to a side of the vibrating member;

a stage for supporting the first member to be joined;

a stage moving portion for horizontally moving the stage in two directions intersecting perpendicularly to each other and for rotating the stage within a horizontal movement plane; and a position displacement detecting device for detecting position displacement between the first member to be joined placed on the stage and the second member to be joined supported by the ultrasonic bonding head.

4. The resonator according to claim 1, with respect to a size of a section of each of the supporting portions parallel with the side face of the vibrating member, a length along the vibration direction of the vibrating member is shorter than that along a depressing direction of the depressing member.

5. The ultrasonic bonding head according to claim 2, with respect to a size of a section of each of the supporting portions parallel with the side face of the vibrating member, a length along the vibration direction of the vibrating member is shorter than that along a depressing direction of the depressing member.

6. The ultrasonic bonding apparatus according to claim 3, with respect to a size of a section of each of the supporting portions parallel with the side face of the vibrating member, a length along the vibration direction of the vibrating member is shorter than that along a depressing direction of the depressing member.

7. A resonator comprising:

a depressing member applying a depressing force to a second member to be joined to a first member, the depressing member having a supporting portion;

a vibrating member vibrated in a first direction by a vibrator, the vibrating member having a first face and a second face parallel with the first direction, the second face being perpendicular to the first face, the vibrating member having two openings on the first face, the vibrating member being supported substantially at the center of the first face by the supporting portion, and the vibrating member being supported between the two openings by the supporting portion; and a holding member disposed at the center of the second face, the holding member holding the second member.

8. An ultrasonic bonding head comprising:

a vibrator vibrating in a first direction;

a depressing member applying a depressing force to a second member to be joined to a first member, the depressing member having a supporting portion;

a vibrating member vibrated by the vibrator, the vibrating member having a first face and a second face parallel with the first direction, the second face being perpendicular to the first face, the vibrating member having two openings on the first face, the supporting portion supporting the vibrating member substantially at the center of the first face, and the supporting portion supporting the vibrating member between the two openings; and a holding member disposed at the center of the second face, the holding member holding the second member.

9. An ultrasonic bonding apparatus comprising:

a vibrator vibrating in a first direction;

a depressing member applying a depressing force to a second member to be joined to a first member, the depressing member having a supporting portion;

a vibrating member vibrated by the vibrator, the vibrating member having a first face and a second face parallel with the first direction, the second face being perpendicular to the first face, the vibrating member having two openings on the first face, the vibrating member being located substantially at the center of the first face, and the supporting portion supporting the vibrating member between the two openings;

a holding member disposed at the center of the second face, the holding member holding the second member; and a stage for supporting the first member.

* * * * *